United States Patent [19]

Howng

[11] Patent Number: 5,200,390

[45] Date of Patent: Apr. 6, 1993

[54] CO-PRECIPITATION PROCESS FOR PREPARING SUPERCONDUCTOR POWDER

[75] Inventor: Wei-Yean Howng, Albuquerque, N. Mex.

[73] Assignee: Motorola Inc., Schaumburg, Ill.

[21] Appl. No.: 526,273

[22] Filed: May 21, 1990

[51] Int. Cl.[5] .................. H01B 12/06; C01G 3/00; C04B 41/89; H01L 39/12
[52] U.S. Cl. .......................... 505/1; 505/737; 505/738; 505/780; 252/518; 252/521; 501/152; 501/123; 423/604; 423/419 R; 423/593; 423/635
[58] Field of Search ............ 505/1, 738, 780, 737; 423/604, 635, 419 R, 593; 252/518, 521; 501/152, 123

[56] References Cited

U.S. PATENT DOCUMENTS

| 4,886,777 | 8/1988 | Kimura et al. ............... 505/1 |
| 5,002,926 | 3/1991 | Spencer et al. ............ 505/738 |
| 5,045,527 | 7/1991 | Ikeno et al. . |

OTHER PUBLICATIONS

Voigt et al., "A Hydroxycarbonate Route to Superconductor Precursor Powders", Mat'l. Res. Soc. Sym., vol. 99, 1988, pp. 634–638.
M. J. Cima, et al., "Powder Processing for Microstructural Control in Ceramic Superconductors," *Advanced Ceramic Materials*, vol. 2, No. 3B, Special Issue, 1987, pp. 329–336.
S. M. Johnson, et al., "Preparation of Superconducting Powders by Freeze-Drying," *Advanced Ceramic Materials*, vol. 2, No. 3B, Special Issue, 1987, pp. 337–342.
B. Dunn, et al., "Properties of Superconducting Oxides Prepared by the Amorphous Citrate Process," *Advanced Ceramic Materials*, vol. 2, No. 3B, Special Issue, 1987, pp. 343–352.
W. Wong-Ng, et al., "X-Ray Powder Characterization of $Ba_2YCu_3O_{7-x}$," *Advanced Ceramic Materials*, vol. 2, No. 3B, Special Issue, 1987, pp. 565–576.
A. Safari, et al., "A Comparative Study of Processing Methods and Property Relations of Y-Ba-Cu-O Superconductors," *IEEE*, 1988, pp. 181–187.

Primary Examiner—Mark L. Bell
Assistant Examiner—Melissa Bonner
Attorney, Agent, or Firm—Donald B. Southard; Douglas D. Fekete

[57] ABSTRACT

A fine stoichiometric superconductor powder may be co-precipitated from the addition of appropriate metal compound powders in ammonium carbonate. The co-precipitated powder is very homogeneous because the reaction progresses in liquid solution. For example, $YBa_2Cu_3O_{7-x}$ superconducting powder may be prepared by the co-precipitation of yttrium oxide, copper (I) acetate, copper (II) acetate and barium acetate. The acetates precipitate by nucleating on the yttrium oxide particles. The process permits a relatively wide window of starting reactant proportions yet still produce ceramics having superconductive properties.

16 Claims, 1 Drawing Sheet

CO-PRECIPITATION PROCESS FOR PREPARING SUPERCONDUCTOR POWDER

FIELD OF THE INVENTION

The invention relates to the preparation of superconductive materials, and in one aspect, more particularly relates to the preparation of superconductor powders by co-precipitation techniques.

BACKGROUND OF THE INVENTION

It is well known that superconductive materials, such as powders and ceramics therefrom, have received greatly increased attention with the discover of a variety of relatively high temperature (liquid nitrogen temperature) superconductor materials. For example, $YBa_2Cu_3O_{7-x}$ is a superconductive ceramic material that is also known as 123 compound or YBC material. The property of this superconductive material, as well as the other superconductors, tends to be process dependent. The transition temperature (metal/semiconductor to superconductor transition) and the room temperature resistivity are very sensitive to the homogeneity and oxygen content of the calcined material. The conventional mixed oxides process produces coarser agglomerate which needs to be calcined for a long time at near melting temperature to achieve a high degree of homogeneity. Stoichiometry on a macro- and micro-scale is of critical importance, particularly with respect to stoichiometry-driven crystal defects. The result is the formation of relatively large size particles. Bulk or thick films made of large particle size powder are very porous and have rough surfaces which are not suitable for radio frequency (RF) applications. Other chemical processes such as amorphous citrate processes and freeze-drying processes are difficult to adapt to mass production at good stoichiometry, which is a requirement for commercialization of these materials.

Good superconductive materials seem to require a certain grain structure. Identified desirable qualities include little or no microcracking at grain boundaries; low resistivity grain boundaries, at least in the direction of current flow; and classical grain-boundary pinning phenomena.

Examples of previous processes are described in many articles that have published in the last few years. However, it would be desirable if a new process were discovered that permitted simple equipment to be used, allowed mass production of stoichiometric fine powders, and which generated no harmful chemical wastes as do some of the known procedures.

SUMMARY OF THE INVENTION

Accordingly, it is an object of the present invention to provide a process for making a homogeneous superconductor powder.

It is another object of the present invention to provide a novel process for making a superconductor powder that uses relatively simple equipment and which produces a fine powder in the correct stoichiometric ratio.

It is yet another object of the invention to provide a process for producing semiconductor powder which provides a relatively wide process window for the starting composition ratio of the respective metal compound powders.

In carrying out these and other objects of the invention, there is provided, in one form, a co-precipitation process for preparing a superconductor powder that has the following steps: (1) suspending a number of metal compound powders in water to form a slurry, where the metal compound powders provide the necessary elements for a particular superconductor; (2) dissolving ammonium carbonate in water to form an ammonium carbonate solution; (3) mixing the slurry with the ammonium carbonate solution to form a mixture; (4) permitting the mixture to precipitate; (5) filtering the mixture; and (6) drying the mixture to form the superconductor powder.

DETAILED DESCRIPTION OF THE INVENTION

Figure 1:
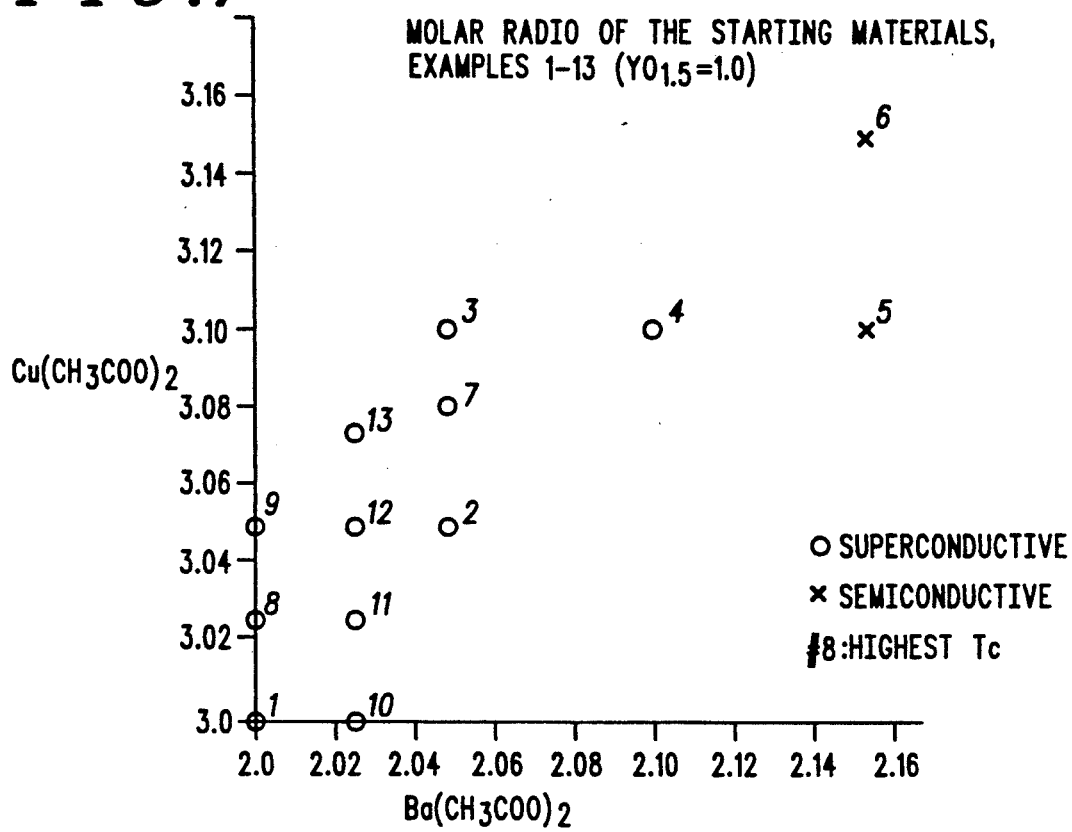
FIG. 1 is a chart of the molar ratio of the starting materials of the $YBa_2Cu_3O_{7-x}$ Examples noting which are superconductive.

It has been discovered that a co-precipitation process involving mixing ammonium carbonate, $(NH_4)_2CO_3$, with a slurry of metal compound powders to form non-water soluble metal precipitates nucleating on suspended oxide particles provides a method of using relatively simple equipment to mass produce stoichiometric, fine superconductor powders with relatively little harmful chemical waste. Because the reaction progresses in liquid solution form, the precipitated compound is very homogeneous. The process does require that certain particles form nucleation sites. For example, to produce $YBa_2Cu_3O_{7-x}$ powders, the precipitated barium and copper carbonates are nucleated on yttrium particles. When $Bi_2CaSr_2Cu_2O_{9-x}$ powders are formed, the copper carbonates and calcium and strontium carbonates nucleate on the bismuth trioxide particles. The decomposition of the carbonates create active surfaces for solid state reaction during calcination. The short reaction distance arising from the intimate packing provides short diffusion paths for quick reaction. The result is the formation of a fine stoichiometric powder.

The process may be outlined in some detail below with reference to a more general method and a more specific method that was used to form the $YBa_2Cu_3O_{7-x}$ superconductive powder examples herein.

TABLE I

| Preparation Methods | |
|---|---|
| General Method | Specific Method |
| (1) Dissolve and suspend a plurality of metal compound powders in water to form a slurry. | (a) Dissolve copper (I) acetate powder, $Cu(CH_3COO)_2$, into deionized (DI) or distilled water. The preferred weight ratio is about 0.065 powder:water.<br>(b) Add the balanced amount of barium acetate powder, $Ba(CH_3COO)_2$, into the solution of (a) and stir until a complete solution is formed. |

TABLE I-continued

Preparation Methods

| General Method | Specific Method |
|---|---|
| | (c) Add the balanced amount of yttrium oxide powder, $Y_2O_3$, into the solution to form a suspension or slurry and continuously stir. |
| (2) Adjust the pH of the slurry to within a range of about 4.5 to about 6.0. | (d) Adjust the slurry (suspension) pH value to about 4.5 by adding acetic acid solution. |
| (3) Dissolve ammonium carbonate in water to form a solution. | (e) Dissolve ammonium carbonate, $(NH_4)_2CO_3$, into the same amount of water as in step (a). The weight ratio of ammonium carbonate to water is preferred to be about 0.167. |
| (4) Mix the slurry with the ammonium carbonate solution to form a mixture. | (f) Slowly co-mingle the slurry with the ammonium carbonate solution and maintain the pH between about 7.0 and about 7.5 by controlling the flow rates of both components. |
| (5) Permitting the precipitation to occur. | (g) Superconductive powder $YBa_2Cu_3O_{7-x}$ precipitates. Precipitation occurs essentially instantaneously, though one may wish to wait to ensure complete precipitation. |
| (6) Filter the mixture. | (h) Filter the co-mingled slurry through a vacuum-assisted filter, or through a filter press. |
| (7) Dry the mixture to form the superconductor powder. | (i) Dry the filtered cake in an oven at low temperature, preferably lower than 100° C. |
| | (j) Crush the dried cake and sieve through a −40 to a −100 sieve. |
| | (k) Calcine the powder at 850 to 950° C. for about 8 hours. |

It will be appreciated that the specific method steps are illustrative only and not limiting of the invention. Steps (i) through (k) of that method may generally regarded as specific implementations of conventional preparation steps for precipitated powders. It is also apparent that steps (a) through (c) are not in any particularly critical sequence. The order of adding the metal compound powders to the water to form the solution or suspension may be altered. However, in one aspect it is preferred that the soluble powders, such as the acetates, be added first, since they may form a solution. Then, the insoluble metal compound which forms the nucleation sites, such as yttrium oxide, is preferably added last to form the suspension.

The adjustment of the slurry pH in general procedure step (2) should place it in a range of about 4.5 to about 6.0, preferably from about 4.5 to about 5.0. This pH adjustment may be performed by adding an acid to the slurry. The acid may be any 100% water miscible carboxylic acid, which may include, but is not limited to acetic acid, formic acid, propionic acid, butyric acid and the like. The adjustment of the slurry pH in mixture of step (4) should place it in a range of about 6.5 to about 8.5, preferably from about 7.0 to about 7.5. As noted, the pH of the mixture is adjusted by controlling the volume ratio of the slurry and the ammonium carbonate solution.

Preferably, the metal compound powders are metal oxides, metal acetates and mixtures thereof. Of course, the known superconductor compound systems are anticipated. As examples only, for a $YBa_2Cu_3O_{7-x}$ system, copper (I) acetate, copper (II) acetate, barium acetate and yttrium oxide may be employed; whereas for a $Bi_2CaSr_2Cu_2O_{9-x}$ superconductor, bismuth trioxide, calcium acetate, strontium acetate, copper (I) acetate, and copper (II) acetate, may be used. Other compounds to make these same superconductor powders may also be employed. However, some care should be taken by the practitioner since some combinations may be unsuitable. For example, $Y(OH)_3$ and $Y_2(CO_3)_3$ (yttrium carbonate) are soluble in the ammonium carbonate solution. Yttrium oxide is probably the best yttrium compound to use in the ammonium carbonate process, although yttrium acetate could be used. Yttrium solutions are acidic by their nature.

Generally, for the $YBa_2Cu_3O_{7-x}$ superconductors, the molar ratio of Y:Ba:Cu is 1:2:3. However, as will be seen, the process of the invention affords a relatively wide starting proportion window. For example, if the yttrium proportion is taken as 1, the barium proportion may range from 2 to 2.1 and the copper proportion may range from 3 to 3.1, relative to the yttrium. Similar latitude is expected in the preparation of the $Bi_2CaSr_2Cu_2O_{9-x}$ superconductor.

The weight ratio of the ammonium carbonate to water in step (3) may range from about 0.10 to about 0.50 carbonate in water and more preferably from about 0.20 to about 0.25. This is not a critical ratio.

Procedurally, the co-precipitation may be performed in any suitably large container. Typically, bubbles evolve during the reaction and care should be taken to permit the reaction to proceed relatively slowly. Agitation or stirring should be employed to accelerate the reaction.

The invention will be illustrated more specifically with reference to the following examples.

EXAMPLES 1-13

Figure 2:
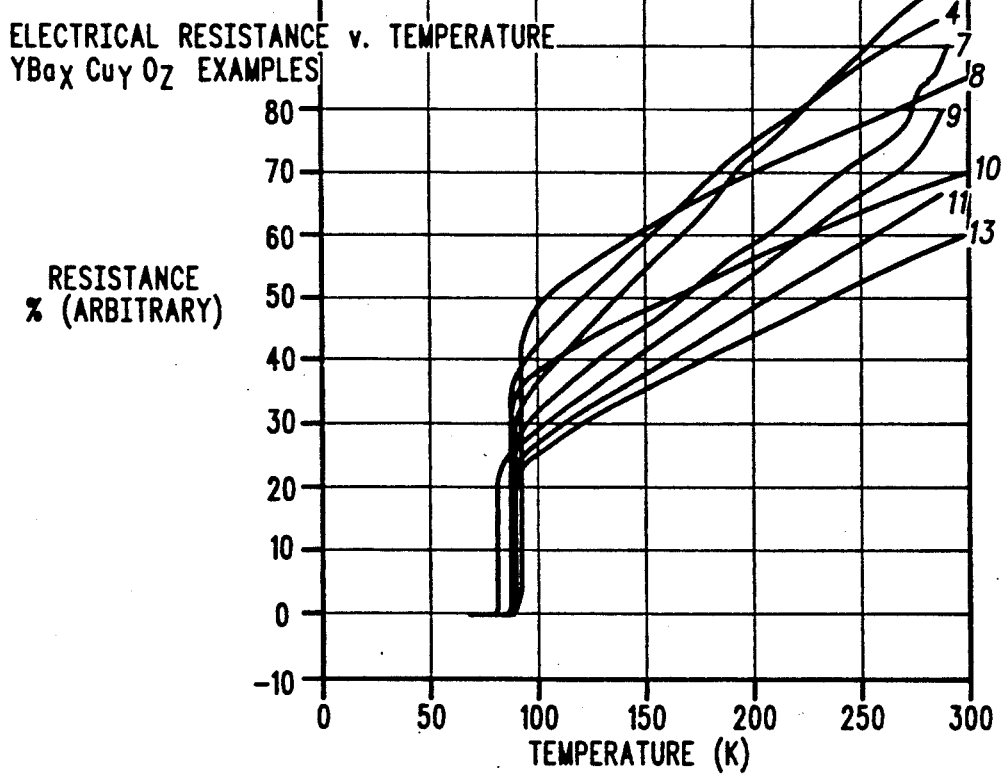
FIG. 2 is a chart of electrical resistance as a function of temperature in degrees K for various of the $YBa_2Cu_3O_{7-x}$ Examples indicating superconductive behavior at about 80° K.

Examples 1 through 13 were prepared according to the more specific process outlined in Table I above to make $YBa_2Cu_3O_{7-x}$ materials. The starting proportions of some of these compositions is given in Table II. It will be appreciated that the proportions do not have to be exactly 1:2:3, but may vary somewhat permitting the process to be tolerant of proportion variables. FIG. 1 illustrates the proportions of the various Examples and whether they exhibited superconductive behavior. FIG. 2 is a plot of electrical resistance as a function of temperature (K) which indicates that indeed Examples 3,4,7,8,9,10,11 and 13 were true superconductors at temperatures below about 80° K.

TABLE II

Composition Molar Ratio for Preparing YBC by the Co-Precipitation Process

| Example No. | $YO_{1.5}$ | $Ba(CH_3COO)_2$ | $Cu(CH_3COO)_2$ |
|---|---|---|---|
| 1 | 1.0 | 2.0 | 3.0 |
| 2 | 1.0 | 2.05 | 3.05 |
| 3 | 1.0 | 2.05 | 3.10 |
| 4 | 1.0 | 2.10 | 3.10 |
| 5 | 1.0 | 2.15 | 3.10 |
| 6 | 1.0 | 2.15 | 3.15 |
| 7 | 1.0 | 2.05 | 3.08 |
| 8 | 1.0 | 2.0 | 3.025 |
| 9 | 1.0 | 2.0 | 3.05 |
| 10 | 1.0 | 2.025 | 3.0 |
| 11 | 1.0 | 2.025 | 3.025 |
| 12 | 1.0 | 2.025 | 3.05 |
| 13 | 1.0 | 2.025 | 3.075 |

The filtrate from step (6) was deep blue in color. After firing (drying) the final powder was dark black. An X-ray diffraction pattern of the calcined powder was compared with the pattern of a known 1-2-3 pellet (W. Wong-Ng, et al., "X-Ray Powder Characterization of $Ba_2YCu_3O_{7-x}$," *Advanced Ceramic Materials*, Vol. 2, No. 3B, Special Issue, 1987, pp. 565-576.) An almost single phase material was synthesized at this stage. The pressed slabs fired at 950° C. in air or oxygen are all exhibited superconductive transition and reach zero resistance at a temperature around 80° K. as shown in FIG. 2. The sintered slabs or rods exhibit very fine grain and crack free texture which cannot be reproduced with the conventional mixed oxides method.

The residue from the process that must be processed is the ammonium carbonate, which is readily decomposed in hot water to ammonia, carbon dioxide and water.

It will be appreciated that modifications may be made in the exact implementation of the invention illustrated in the above example which would still fall within the spirit and scope of the invention as claimed herein. For example, it is anticipated that the reaction conditions, modes or sequences of addition, exact combinations of materials may be altered to optimize the invention by one skilled in the art. It is also expected that the method of this invention could be used to prepare other superconductive powders beyond those particularly prepared herein.

I claim:

1. A co-precipitation process for preparing a superconductor powder comprising:
   suspending an insoluble yttrium compound powder in an aqueous solution containing dissolved copper and barium salts to form a slurry,
   adding an aqueous ammonium carbonate solution to the slurry, whereupon a precipitate forms that comprises copper and barium carbonate compounds deposited onto the yttrium compound powder,
   drying the precipitate, and
   calcining the dried precipitate to form the superconductor powder.

2. The co-precipitation process of claim 1 where the yttrium compound powder is yttrium oxide powder and the dissolved copper and barium salts are copper acetate and barium acetate.

3. The co-precipitation process of claim 1 where the the pH of the slurry prior to addition of the ammonium carbonate solution is between about 4.5 and about 6.0.

4. The co-precipitation process of claim 1 where the ammonium carbonate solution is formed by dissolving ammonium carbonate in water.

5. The co-precipitation process of claim 1 where the pH of the slurry during the addition of ammonium carbonate solution is maintained between about 6.5 and 8.5.

6. The co-precipitation process of claim 1 where the precipitate is calcined at a temperature between about 850° C. and 950° C. to form the superconductor powder.

7. A co-precipitation process for preparing a superconductor powder comprising
   suspending an insoluble yttrium oxide powder in an aqueous solution containing dissolved copper and barium salts to form a slurry,
   adjusting the pH of the slurry to between about 4.5 and 6.0,
   adding an aqueous ammonium carbonate solution to the slurry while maintaining the pH of the slurry between about 6.5 and 8.5, whereupon a precipitate forms that comprises copper and barium carbonate compounds deposited onto the yttrium oxide powder, and
   drying the precipitate, and
   calcining the dried precipitate to form the superconductor powder.

8. The co-precipitation process of claim 7 where the dissolved copper and barium salts are copper acetate and barium acetate.

9. The co-precipitation process of claim 7 where the ammonium carbonate solution is formed by dissolving ammonium carbonate in water.

10. The co-precipitation process of claim 7 where the pH of the slurry prior to addition of the ammonium carbonate solution is adjusted to between about 4.5 and 5.0.

11. The co-precipitation process of claim 7 where the pH of the suspension during addition of the ammonium carbonate solution is maintained between about 7.0 and 7.5.

12. The co-precipitation process of claim 7 where the precipitate is calcined at a temperature between about 850° C. and 950° C.

13. A superconductor powder prepared by a co-precipitation process comprising the steps of:
   suspending an insoluble yttrium compound powder in an aqueous solution containing dissolved copper and barium salts to form a slurry,
   adding an aqueous ammonium carbonate solution to the slurry, whereupon a precipitate forms that comprises copper and barium carbonate compounds deposited onto the yttrium compound powder, and
   drying the precipitate, and
   calcining the dried precipitate to form the superconductor powder.

14. The superconductor powder of claim 13 where the dissolved copper and barium salts are copper acetate and barium acetate.

15. A superconductor powder prepared by a co-precipitation process comprising the steps of
   suspending an insoluble yttrium oxide powder in an aqueous solution containing dissolved copper and barium salts to form a slurry,
   adjusting the pH of the slurry to between about 4.5 and 6.0,
   adding an aqueous ammonium carbonate solution to the slurry while maintaining the pH of the slurry between about 6.5 and 8.5, whereupon a precipitate forms that comprises copper and barium carbonate compounds deposited onto the yttrium oxide powder, and drying the precipitate, and calcining the dried precipitate to form the superconductor powder.

16. The superconductor powder of claim 15 where the dissolved copper and barium salts are copper acetate and barium acetate.

* * * * *